(12) United States Patent
Aoki

(10) Patent No.: US 6,630,722 B1
(45) Date of Patent: Oct. 7, 2003

(54) SOLID STATE IMAGE SENSING DEVICE HAVING HIGH IMAGE QUALITY AND FABRICATING METHOD THEREOF

(75) Inventor: Tetsuro Aoki, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/545,594

(22) Filed: Apr. 7, 2000

(30) Foreign Application Priority Data

May 26, 1999 (JP) ............................................ 11-146509

(51) Int. Cl.⁷ .......................................... H01L 31/0232
(52) U.S. Cl. ....................................... 257/435; 257/432
(58) Field of Search ........................ 250/226; 257/432, 257/291, 292, 435

(56) References Cited

U.S. PATENT DOCUMENTS

| | | | | |
|---|---|---|---|---|
| 5,336,919 A | * | 8/1994 | Toriyama | 257/435 |
| 5,637,894 A | * | 6/1997 | Hori et al. | 257/249 |
| 6,255,640 B1 | * | 7/2001 | Endo et al. | 250/208 |

FOREIGN PATENT DOCUMENTS

| | | |
|---|---|---|
| JP | 3-98002 | 4/1991 |
| JP | 11-027588 | 1/1999 |

* cited by examiner

*Primary Examiner*—Tom Thomas
*Assistant Examiner*—Samuel A Gebremariam
(74) *Attorney, Agent, or Firm*—Nixon & Vanderhye P.C.

(57) ABSTRACT

A color filter is formed by directly coating a color filter material on the entire groundwork device surface so as to bury the material in a recessed region, subjecting the material to pattern transfer exposure and thereafter subjecting the resulting material to a developing process. The thickness striation of the device is thus improved by burying the color filter material from a low position without interposition of a resist pattern layer. The edges of the color filter is formed into a forward taper shape, thereby assuring the continuity of the filter to the color filters of the other colors formed adjacent to the filter. A groundwork alignment mark can be directly detected from the surface of the color filter material that is located at a short distance from the substrate in the pattern transfer exposure process stage, so that a detection error is reduced for the reduction of image deterioration. There is formed no transparent layer such as a flattening layer in order to reduce an error in detecting the groundwork alignment mark when forming a microlens and to further improve the image quality. A high-quality solid state image sensing device remarkably contracted in the vertical direction can be thus obtained.

3 Claims, 4 Drawing Sheets

SOLID STATE IMAGE SENSING DEVICE HAVING HIGH IMAGE QUALITY AND FABRICATING METHOD THEREOF

BACKGROUND OF THE INVENTION

The present invention relates to a solid state image sensing device and a fabricating method of the device, and, in particular, to a solid state image sensing device in which a color filter is formed on a photoelectric conversion section (light-receiving section) and a fabricating method of the device.

There has conventionally been a CCD solid state image sensing device whose unit cell is shown in a cross-section view of FIG. 2. The groundwork device of this CCD solid state image sensing device has a periodical gap in level of several micrometers due to the provision of electrodes 3 and light-shielding films 5. The uppermost surface of the groundwork device is covered with a protecting film 6 made of $Si_3N_4$ or the like. Therefore, in the so-called on-chip process to be performed subsequent to the formation of the groundwork device, it is required to reduce the difference in level of the groundwork device by forming a flattening layer 7 by spin coating a transparent flattening material prior to the formation of color filters 8, 9 and 10 and thereafter form the color filters 8, 9 and 10.

However, in accordance with the progress of the improvement in integration density of pixels, there is a growing demand for the contraction of the device in the z-direction in addition to the contraction in the x- and y-directions. In FIG. 2 are shown a substrate 1, a light-receiving section (photoelectric conversion section) 2, an interlayer insulating film 4, a protecting layer 11 and a microlens 12.

FIG. 3 shows a schematic view of an optical system in the unit cell shown in FIG. 2. In FIG. 3, if a distance L in the z-direction from the light-receiving section 2 to the microlens 12 is long, then an oblique incident light 15 is shielded by a projecting portion 13 constructed of the electrode 3 and the like. Therefore, the incident light cannot be effectively utilized. It is to be noted that the reference numeral 14 denotes a perpendicular incident light.

In an image-taking device (camera or the like) employing a solid state image sensing device, its optical system has become compacted together with the development in integration density, and accordingly, there is a growing trend toward employing a lens having a very short exit pupil position. As shown in FIG. 4, the lens having a very short exit pupil position is characterized in that the rate of the oblique incident light 20 relative to the total luminous flux incident on an imaging region 17 of the solid state image sensing device 16 is increased since the incident angle of light on the surface of the solid state image sensing device 16 becomes increased in comparison with the normal lens in the case of the short exit pupil position lens 18. As a result, the quantity of incident light looses its uniformity between the center portion and the peripheral portion of the imaging region 17, consequently generating a shading phenomenon. This shading phenomenon occurs principally because the luminous flux tends to be scattered by the projecting portions (including the light shielding film) constructed of the transfer section of the solid state image sensing device 16 since the incident angle of the oblique incident light 20 is greater in the peripheral portion than in the center portion of the imaging region 17. Then, this shading phenomenon occurs more significantly as the distance in the z-direction from the light-receiving section of the solid state image sensing device 16 to the microlens increases, as described above. It is to be noted that the reference numeral 19 denotes a perpendicular incident light.

On the other hand, there is a demand for improving the image quality in terms of the tone of color, and it is required to further improve the quality of the transmission color spectral characteristic of the color filter in accordance with the requirement. It is, then, required to improve the quality of hue for the above purpose, and increasing the film thickness of the color filter can cope with this. However, increasing the film thickness of the color filter is not compatible with the requirement of the aforementioned contraction in the z-direction.

There is another severe requirement for the registration (alignment accuracy) with respect to the aforementioned groundwork device in the process of forming the color filters 8, 9 and 10 and the microlens 12 in FIG. 2 in forming a solid state image sensing device, due to the high integration as described above, in comparison with the conventional requirement. In this case, with regard to the wafer alignment, the groundwork device and the upper layer are aligned in position with each other by detecting light obtained by reflecting and refracting a beam of laser light from the alignment mark formed on the groundwork device via the flattening layer 7. However, the focus position detection of the alignment mark via the flattening layer 7 having a thickness of several micrometers tends to optically cause a large detection error.

Such a detection error sensitively exerts bad influence on the image quality when applied to the case where the color filters 8, 9 and 10 are formed on the flattening layer 7. That is, as shown in FIG. 5, a cross-talk light (mixture color light) 22 incident on the adjacent pixel 21' increases in ratio to the normal light 23 as the thickness H of the flattening layer 7 increases even if the quantity of displacement D between the pixel 21 and the color filters 8, 9 and 10 is identical.

The above has described several problems, which have emerged as the problems in accordance with the development in the integration density of the solid state image sensing device. These problems are attributed to the formation of the color filters 8, 9 and 10 after the formation of the thick flattening layer 7 (in other words, with a long distance between ground work device surface and color filters provided in the z-direction) on the groundwork device.

As a method for resolving the aforementioned problems, there is a known solid state image sensing device color filter fabricating method as disclosed in the prior art reference of Japanese Patent Laid-Open Publication No. HEI 3-98002. This solid state image sensing device color filter fabricating method will be described below with reference to FIG. 6.

First, as shown in FIG. 6A, a stepped portion 27 constructed of an electrode, a light shielding film or the like is formed between light-receiving sections (photoelectric conversion sections) 26 on a substrate 25, by which a solid state image sensing device is obtained. Then, a resist layer 28 is coated on this solid state image sensing device, filling the portions having a difference in level between the stepped portions 27 with the layer. Next, as shown in FIG. 6B, a plurality of specified regions around the light-receiving sections 26 of an identical color are opened through the resist layer 28, and a polymer resin layer (referred to as a coloring layer hereinafter) 29 that includes dye of the corresponding color is formed throughout the entire surface including the opening portions 31, consequently burying the coloring layer 29 in the aforementioned specified regions. Next, as shown in FIG. 6C, the coloring layer 29 is etched back to leave the coloring layer 29 only in the opening portions. Subsequently, as shown in FIG. 6D, the resist layer 28 is removed by a releasing liquid.

Then, by repeating a series of processes shown in FIGS. 6A through 6D for the light-receiving sections 26 of all the colors and laying a plurality of coloring layers 29a through 29d on all the light-receiving sections 26, the coloring layers 29a through 29d are formed into color filters. Subsequently, a flattening layer 30 is formed.

However, the solid state image sensing device color filter fabricating method disclosed in the prior art reference of Japanese Patent Laid-Open Publication No. HEI 3-98002 has the following problems. That is, in the process shown in FIG. 6B, the coloring layer (polymer resin layer) 29 is buried after the patterning of the resist layer 28. Therefore, the resist stepped portion 31 generated when patterning the resist layer 28 is added to the originally existing stepped portion 32, causing the coloring layer 29 to be buried in the portion having the great difference in level. Therefore, the coating film thickness of the coloring layer 29 comes to have a nonuniformity (striation), possibly causing the case where the stepped portion constructed of the "resist stepped portion 31+stepped portion 32" cannot be completely filled up in extreme cases.

The patterning of the resist layer 28 is performed on the light shielding film (not shown) located above the stepped portion 27. However, the patterning tends to receive halation from the light shielding film in the above case, as a consequence of which the resist layer 28 comes to have a forwardly tapered edge shape. Therefore, if the polymer resin that becomes the coloring layer 29 is buried, then the buried coloring layer 29 becomes reversely tapered reflecting the groundwork pattern (edge pattern of the resist layer 28). As a result, a void is generated at the edge portion of the adjacent color filter. That is, mutually adjoining color filters 29 cannot be continuously formed in contact with one another as in the case of the color filters 8, 9 and 10 shown in FIG. 2. This disadvantageously causes deterioration in image quality.

For the reason that the unnecessary portion of the polymer resin of the coloring layer 29 is removed by etchback (degree of etchback tends to be generally varied) for each color, there is the problem that the surfaces of the coloring layers (filters) 29 do not become flat.

As described above, according to the solid state image sensing device color filter fabricating method disclosed in the prior art reference of Japanese Patent Laid-Open Publication No. HEI 3-98002, the considerably thick flattening layer 30 must be formed for the reason that the mutually adjoining coloring layers 29 cannot be formed in contact with one another and the surfaces of the coloring layers 29 do not become flat. As a result, the distance in the vertical direction from the light-receiving section 26 to the microlens (not shown) is not reduced regardless of the fact that the coloring layers 29a through 29d are directly formed while being buried in the portions having a difference in level between the stepped portions 27, meaning that the improvement of the shading phenomenon and the detection error of the groundwork alignment mark can be scarcely expected.

SUMMARY OF THE INVENTION

Accordingly, the object of the present invention is to provide a solid state image sensing device that has high accuracy and high image quality and is remarkably contracted in the vertical direction and a fabricating method of the device.

In order to achieve the object, there is provided a solid state image sensing device comprising: a unit cell having a projecting region constructed of a transfer region formed on a substrate and a recessed region constructed of a light-receiving region located adjacent to the projecting region of the substrate; and a microlens having color filter formed on the unit cell,
the color filters being directly buried in the recessed region, formed in contact with adjacent color filters and formed to have a roughly flattened surface.

According to the above construction, the color filter is directly formed while being buried in the recessed regions located between the projecting regions constructed of the transfer regions formed on the substrate, and the mutually adjoining color filters are formed in contact with one another. Therefore, the shielding of the oblique incident light is reduced to improve the shading phenomenon and prevent the deterioration in image quality.

The aforementioned color filter is formed in a position close to the substrate without no flattening layer. Therefore, the detection error of the groundwork alignment mark in forming the color filter is small, and the detection error of the color filter is small. Furthermore, the microlens is necessarily formed in a position close to the substrate. Therefore, the detection error of the groundwork alignment mark in forming the microlens is small, and the detection error of the microlens is small. As a result, an image of a further improved quality can be obtained.

That is, according to the present invention, the dimension in the vertical direction can be reduced without degrading the performance of the device. This can consequently improve the aforementioned shading defect, improve the substantial alignment accuracies of the color filter and the microlens and restrain the deterioration in image quality due to cross-talk, allowing a high-accuracy high-precision solid state image sensing device to be obtained.

Also, there is provided a method for fabricating a solid state image sensing device comprising: a unit cell having a projecting region constructed of a transfer region formed on a substrate and a recessed region constructed of a light-receiving region located adjacent to the projecting region of the substrate; and a microlens having color filter formed on the unit cell,
the method comprising the steps of:
repetitively performing by the number of colors of the color filters a process for coating a color filter material on an array of the unit cells, thereafter forming the color filter material into a specified pattern including a specified recessed portion and directly burying the color filter material in the recessed portion so that mutually adjacent color filters are brought in contact with one another.

According to the above construction, the color filter is formed by directly burying the color filter material in the recessed regions located between the projecting regions constructed of the transfer regions formed on the substrate. With this arrangement, the color filter is formed on the surface having a smaller difference in level, as a consequence of which the striation is likely to be prevented to allow the surface to be roughly flattened. This obviates the need for the formation of the flattening layer and reduces the dimension in the vertical direction. Furthermore, the edge shape of the color filter comes to have a forward taper, and therefore, no void is generated in the edge portion of the adjoining color filters. Therefore, the mutually adjoining color filters are brought in contact with one another and continuously formed. As a result, the deterioration in image quality is prevented.

Furthermore, the color filter is formed in the position closer to the substrate without no flattening layer. Therefore, the detection error of the groundwork alignment mark in forming the color filter is small, and the detection error of the color filters becomes reduced. Furthermore, the microlens is necessarily formed in a position close to the substrate. Therefore, the detection error of the groundwork alignment mark in forming the microlens is reduced, and the detection error of the microlens becomes reduced. An image of a further improved quality is thus obtained.

That is, according to the present invention, the dimension in the vertical direction can be reduced without degrading the performance of the device. This can consequently improve the aforementioned shading defect, improve the substantial alignment accuracies of the color filter and the microlens and restrain the deterioration in image quality due to cross-talk, allowing a high-accuracy high-precision solid state image sensing device to be obtained.

In one embodiment of the present invention, the color filter material is provided by a chromophilic polymer material made of a photosensitive resin.

According to the above construction, the color filter employing the chromophilic polymer material made of a photosensitive resin is formed in the recessed regions without no flattening layer while being put in contact with the adjoining color filters. The deterioration in image quality is thus prevented.

Therefore, by making the color filter have a substantial film thickness two or more times greater than the normal thickness, the degree of freedom in improving the color density can be improved with the dimensional contraction in the vertical direction.

In one embodiment of the present invention, the color filter material is provided by a color resist.

According to the above construction, the color filter employing the color resist is formed in the recessed regions without no flattening layer while being put in contact with the adjoining color filters. The deterioration in image quality is thus prevented.

Therefore, by making the color filter have a substantial film thickness two or more times greater than the normal thickness, the degree of freedom in improving the color density and the degree of freedom in improving the characteristics with the reduction in the colorant incorporation quantity of the color resist material can be improved with the dimensional contraction in the vertical direction.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
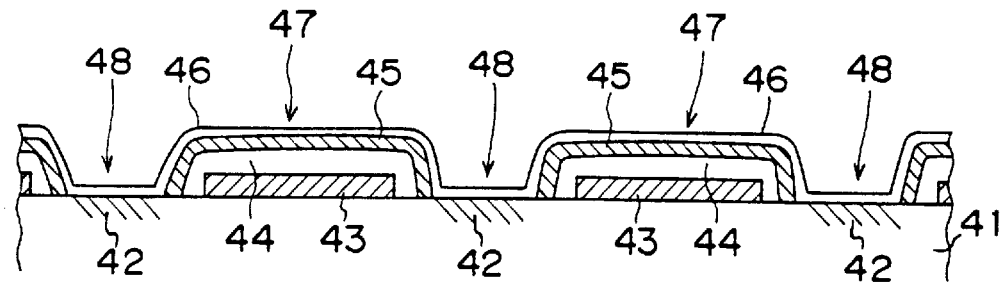
FIGS. 1A through 1D are views showing the solid state image sensing device fabricating method of the present invention.

The present invention will be described in detail below on the basis of the embodiments thereof shown in the drawings. FIGS. 1A through 1D are views showing the solid state image sensing device fabricating method of the present embodiment. As shown in FIG. 1A, the unit pixel of the groundwork device is constructed of a combination of a light-receiving section (photoelectric conversion section) 42 formed on a substrate 41 and a projecting region 47 that serves as an electron transfer section made up of an electrode 43, an interlayer insulating film 44, a light shielding film 45 and a protecting film 46, which are formed between the light-receiving sections 42.

Figure 1B:
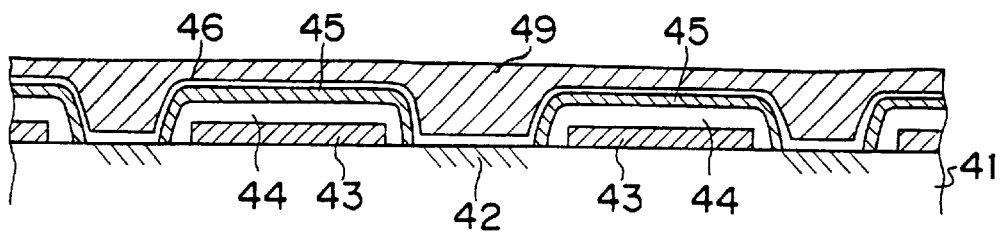

First, as shown in FIG. 1B, a color filter material 49 is directly coated on the entire surface including the recessed regions 48 (the regions of the light-receiving sections 42) between the projecting regions 47 by the spin-coating method or the like. With this arrangement, the striation can be improved in comparison with the case where the color filter material is buried via the patterned resist layer in a state in which a large difference in level exists as exemplified by the aforementioned prior art reference of Japanese Patent Laid-Open Publication No. HEI 3-98002.

In this case, the color filter material 49 may be a chromophilic ground substance or a colored color resist. If there is a problem about adhesion or coating property, then the problem can be eliminated by vapor phase coating an adhesion reinforcing agent (hexamethyldisilazane, for example) on the surface of the groundwork device or incorporating a surface active agent into the color filter material 49. It is better to optimize the viscosity of the color filter material 49 to be coated in order to uniformly bury the color filter material 49 in the recessed region 48 of the light-receiving section 42. That is, for example, by controlling the viscosity to a low viscosity of not greater than 10 CP and coating the color filter material 49 at a relatively low spinning velocity of not greater than 2000 rpm, the occurrence of striation can be prevented.

Figure 1C:
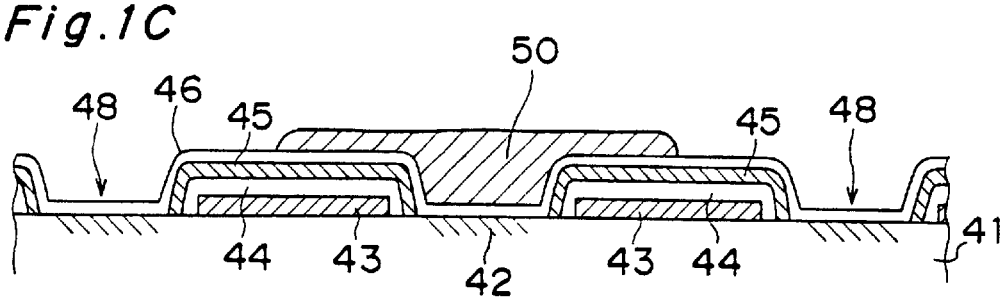

Next, the uniformly coated color filter material 49 is subjected to pattern transfer exposure in order to leave the color filter material 49 in the specified regions, and thereafter the following developing process is performed. That is, if the color filter material 49 is a chromophilic ground substance, then a dying process and a fixing process by means of tannic acid and tartar emetic are performed. In the case of a color resist, a hardening process is performed with a heat treatment instead of the fixing process. Thus, as shown in FIG. 1C, the color filter 50 of the specified color is formed only in the specified region around the light-receiving section 42 of the specified color.

In the above case, the edges of the remaining color filter 50 are formed into a forward taper shape, and therefore, continuity to the color filters of the other colors to be subsequently adjacently formed can be assured. Through photolithography performed after the coating of the color filter material 49, the alignment use target mark formed on the groundwork can be directly detected from the surface of the color filter material 49 located near the substrate 41. Therefore, the detection error is very little in comparison with the case where the detection is performed from a position far away from the substrate 41 via the thick flattening layer as exemplified by the aforementioned prior art reference of Japanese Patent Laid-Open Publication No. HEI 3-98002, and the finished pattern shape has good symmetry as shown in FIG. 1C.

Figure 1D:
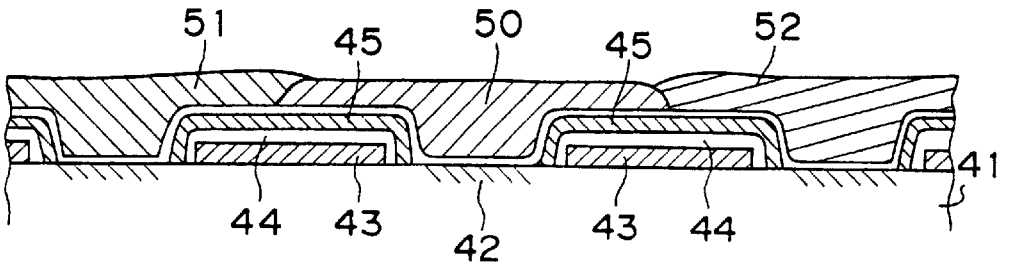
Figure 2:
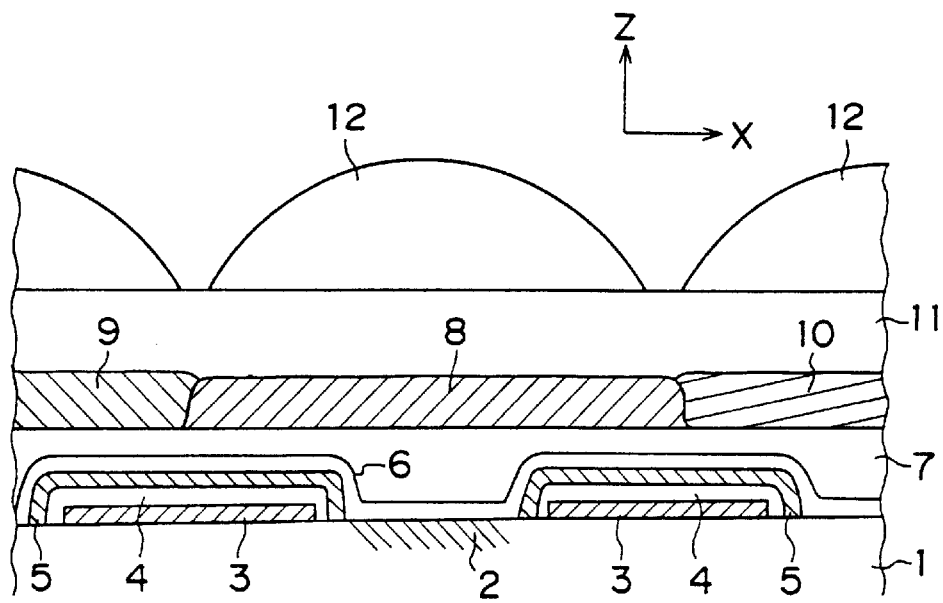
FIG. 2 is a sectional view of the unit cell of a conventional CCD solid state image sensing device.
Figure 3:
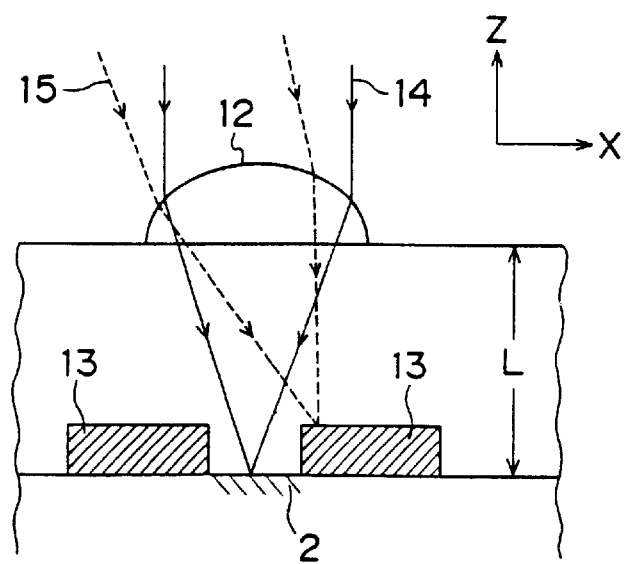
FIG. 3 is a schematic view of the conception of an optical system in the unit cell of FIG. 2.
Figure 4:
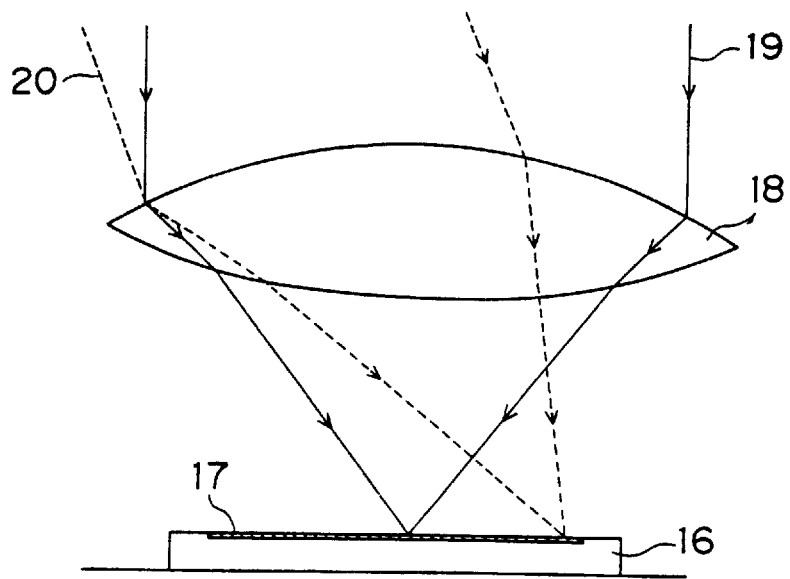
FIG. 4 is an explanatory view of the characteristics of a lens having a very short exit pupil position.
Figure 5:
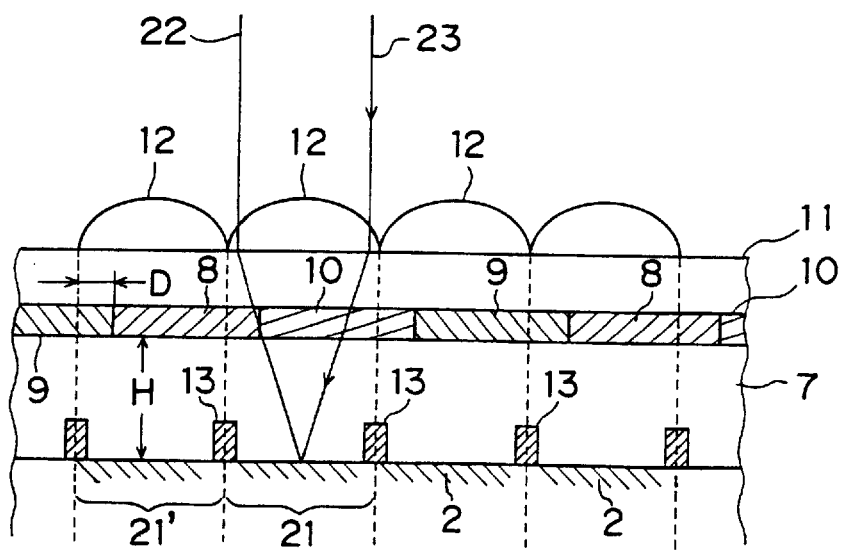
FIG. 5 is an explanatory view of bad influence of a detection error of the color filter relative to the groundwork device exerted on image quality.
Figure 6A:
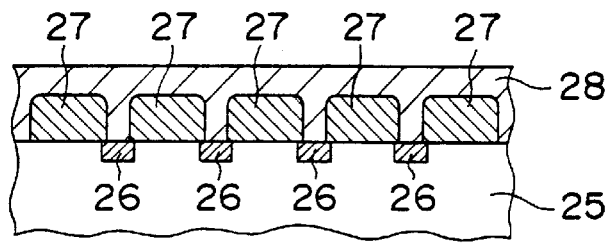
FIGS. 6A through 6E are explanatory views of a method for fabricating an optical color filter for use in the conventional solid state image sensing device.
Figure 6B:
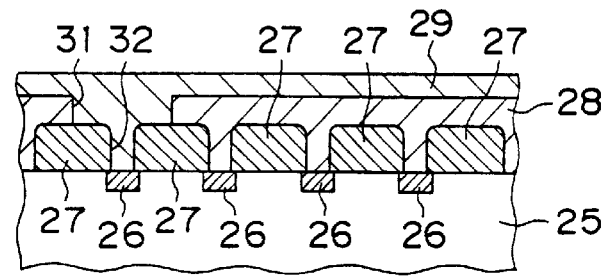
Figure 6C:
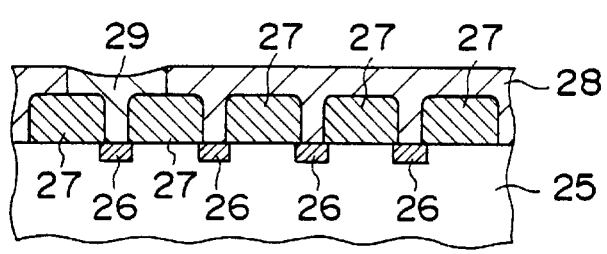
Figure 6D:
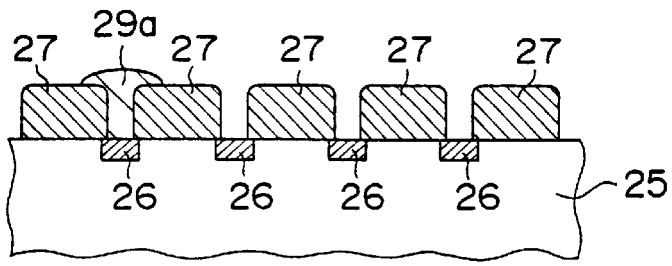
Figure 6E:
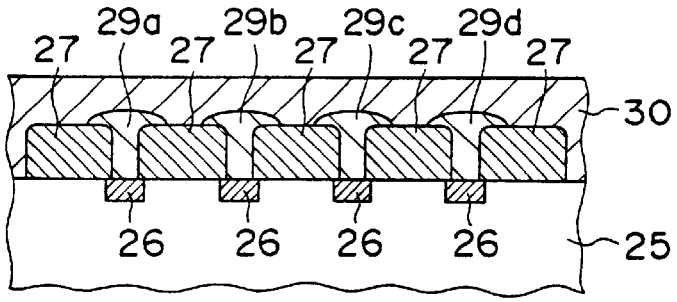

Subsequently, by repeating the color filter forming process similar to the aforementioned process by the specified number of colors, the color filters 50, 51 and 52 of all the colors are formed as shown in FIG. 1D. In the above state, the difference in level of several micrometers that has existed on the groundwork device in FIG. 1A is reduced to a value of not greater than one-tenth thereof or roughly flattened. Together with this, the mutually adjacently formed color filters 50, 51 and 52 are continuously formed, allowing the image quality to be improved.

The substantial film thickness of the color filters 50, 51 and 52 buried in the recessed regions 48 becomes about two times the normal thickness. This significantly improves the degree of freedom in increasing the color densities of the color filters 50, 51 and 52 and is therefore able to improve the image quality. If the color density is the same as the conventional density, then the degree of freedom is remarkably improved in terms of the reduction in the quantity of colorant to be incorporated (quantity of colorant dispersed or dissolved) for the purpose of improving the storage stability and characteristics (resist sensitivity) of the color resist material. That is, according to the present embodiment, the improvement in hue and the improvement in characteristics of the color resist can be achieved with the contraction in the z-direction.

Next, an overcoat layer is formed of a transparent material such as an acrylic material in order to flatten the very small difference in level and protect the color filters 50, 51 and 52 after the formation of the color filters 50, 51 and 52. Although not described in detail, the process flow subsequently shifts to a microlens forming process similarly to the case of the fabrication of the conventional solid state image sensing device. Even in this microlens forming process, the error in detecting the groundwork alignment mark in the microlens forming stage can be reduced because of the removal of the transparent layer such as the flattening layer that has been formed under the color filters in the case of the conventional solid state image sensing device fabricating method. Therefore, the image quality can be further improved.

As described above, in the present embodiment, the color filter material 49 is directly coated on the entire surface of the groundwork device, so that the recessed region 48 (the region of the light-receiving section 42) is filled with the material. With this arrangement, the striation can be improved in comparison with the case where the color filter material is buried from a high position via the patterned resist layer. Subsequently, the color filter 50 is formed by subjecting the color filter material 49 to the pattern transfer exposure and thereafter to the developing process. Therefore, the edges of the color filter 50 are formed into a forward taper shape, and this can assure the continuity to the color filters 51 and 52 of the other colors to be adjacently formed. The groundwork alignment mark can be directly detected from the surface of the color filter material 49 located near the substrate 41 in the pattern transfer exposure stage. Therefore, the deterioration in image quality can be reduced with a reduction in detection error.

By making the buried color filters 50, 51 and 52 have a substantial film thickness two or more times greater than the normal thickness, the degree of freedom in improving the color densities of the color filters 50, 51 and 52 and the degree of freedom in improving the characteristics with a reduction in the colorant incorporation quantity of the color resist material in the case of the same color density as the conventional density can be improved with the contraction in the z-direction.

Even when forming the microlens, the conventional transparent layer such as the flattening layer is not formed, and therefore, the error in detecting the groundwork alignment mark can be reduced. Therefore, the image quality can be further improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state image sensing device comprising:

a unit cell having a projecting region comprising a transfer region formed on a substrate and at least one recessed region comprising a light-receiving region located adjacent to the projecting region, and a microlens and color filters formed on the unit cell, wherein the transfer region comprises a transfer electrode and a light shielding layer provided over the transfer electrode; and at least one of the color filters being directly buried in the recessed region so that no more than a single insulating layer is provided between the at least one color filter and the substrate in the recessed region, the at least one color filter formed in contact with adjacent color filters, and wherein said insulating layer is provided under at least a portion of the color filter but over the light shielding layer of the transfer region.

2. A solid state image sensing device comprising:

a unit cell having a projecting region constructed of a transfer region formed on a substrate and at least one recessed region constructed of a light-receiving region located adjacent to the projecting region, and a microlens and color filters formed on the unit cell, wherein the transfer region comprises at least one metallic light shielding layer covering at least a portion of a transfer electrode;

at least one of the color filters being directly buried in the recessed region so that the at least one color filter is at least partially located at an elevation below a top surface of an electrode of the transfer region, the at least one color filter being formed in contact with adjacent color filters and formed to have an approximately flattened surface; and an insulating layer provided both (a) under at least a portion of the color filter so as to be between the color filter and the substrate, and (b) over the light shielding layer of the transfer region.

3. A solid state imaging device comprising:

a semiconductor substrate including a plurality of photo sensor light receiving regions, each of the photo sensor light receiving regions defining a recessed region by being located adjacent to at least one projecting region comprising a transfer electrode, an interlayer insulating film and a light shielding layer;

a plurality of color filters, each of the color filters contacting at least one adjacent color filter so as to form a continuous color filter layer; and wherein each of the color filters is at least partially located in a respective one of the recessed regions so that no more than a single insulating layer is provided between the semiconductor substrate and the color filter layer in a plurality of the recessed regions, and wherein the single insulating layer is provided under at least a portion of the color filter but over the light shielding layer of the transfer region.

* * * * *